(12) United States Patent
Wang

(10) Patent No.: US 12,015,067 B2
(45) Date of Patent: Jun. 18, 2024

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 79 days.

(21) Appl. No.: 17/231,451

(22) Filed: Apr. 15, 2021

(65) Prior Publication Data

US 2021/0399105 A1 Dec. 23, 2021

(30) Foreign Application Priority Data

Jun. 19, 2020 (CN) .......................... 202010567170.3

(51) Int. Cl.
| | |
|---|---|
| H01L 29/423 | (2006.01) |
| H01L 21/8234 | (2006.01) |
| H01L 27/088 | (2006.01) |
| H01L 29/66 | (2006.01) |

(52) U.S. Cl.
CPC .................. *H01L 29/42376* (2013.01); *H01L 21/823431* (2013.01); *H01L 21/823456* (2013.01); *H01L 27/0886* (2013.01); *H01L 29/66545* (2013.01)

(58) Field of Classification Search
CPC ..... H01L 21/823481; H01L 21/823456; H01L 21/823878
See application file for complete search history.

(56) References Cited

U.S. PATENT DOCUMENTS

| | | | |
|---|---|---|---|
| 2016/0181425 A1* | 6/2016 | Bai | H01L 27/1211 438/283 |
| 2016/0233094 A1* | 8/2016 | Anderson | H01L 21/28123 |
| 2017/0110454 A1* | 4/2017 | Chang | H01L 29/495 |
| 2019/0348414 A1* | 11/2019 | Hong | H01L 21/823481 |
| 2021/0335674 A1* | 10/2021 | Lin | H01L 29/785 |

FOREIGN PATENT DOCUMENTS

CN 105529263 A 4/2016

* cited by examiner

*Primary Examiner* — Tuan A Hoang
(74) *Attorney, Agent, or Firm* — Anova Law Group, PLLC

(57) ABSTRACT

A semiconductor structure and a fabrication method are provided. The semiconductor structure includes: a base substrate; a gate structure on the base substrate, including a first portion in a first region and a second portion in a second region; and one or more stop layers on the base substrate and located in the first portion of the gate structure in the first region. A length of the first portion of the gate structure in the first region is larger than a length of the second portion of the gate structure in the second region.

16 Claims, 16 Drawing Sheets

SEMICONDUCTOR DEVICE AND FABRICATION METHOD THEREOF

CROSS-REFERENCES TO RELATED APPLICATION

This application claims the priority of Chinese Patent Application No. 202010567170.3, filed on Jun. 19, 2020, the content of which is incorporated herein by reference in its entirety.

TECHNICAL FIELD

The present disclosure generally relates to the field of semiconductor technology and, more particularly, relates to a semiconductor device and its fabrication method.

BACKGROUND

As the electronic industry constantly develops towards smaller and faster electronic devices, smaller and faster electronic devices can simultaneously support a larger number of more and more complex cutting-edge functions. Therefore, the continuing trend in the semiconductor industry is to manufacture low-cost, high-performance, and low-power integrated circuits (ICs). These goals have been achieved to a large extent by scaling down the size of semiconductor ICs (for example, minimizing characteristic dimensions (CD)) to improve production efficiency and reduce related costs. However, this scaling down also increases the complexity of the semiconductor manufacturing process. Therefore, the continuous development of semiconductor ICs and devices requires simultaneous progress in semiconductor manufacturing processes and technologies.

A gate structure is a part of a device, and its material greatly affects the performance of the device. A traditional polysilicon gate process has a "polysilicon depletion" effect that affects device conduction, so a metal gate is introduced. After the metal gate is introduced, an interconnection metal layer needs to be formed on the metal gate to form an electrical connection with the outside world.

However, the quality of the gate structure in the existing technologies needs to be further improved.

SUMMARY

One aspect of the present disclosure provides a semiconductor device. The semiconductor device includes: a base substrate; a gate structure on the base substrate, including a first portion in a first region and a second portion in a second region; and one or more stop layers on the base substrate and located in the gate structure in the first region. A length of the first portion of the gate structure in the first region is larger than a length of the second portion of the gate structure in the second region.

Optionally, the one or more stop layers are made of a material including $SiN_x$, $SiO_2$, SiC, SiON, SiOC, SiCN, SiOCN, SiCBN, or a combination thereof.

Optionally, the base substrate includes a substrate and a plurality of fins discrete from each other on the substrate. The plurality of fins includes a sparse region and a dense region. A distance between adjacent fins of the plurality of fins in the sparse region is larger than a distance between adjacent fins of the plurality of fins in the dense region.

Optionally, the first portion of the gate structure in the first region is located between the plurality of fins in the sparse region, and the second portion of the gate structure in the second region is located between the plurality of fins in the dense region.

Optionally, the length of each portion of the gate structure is a distance of each portion of the gate structure across corresponding adjacent fins of the plurality of fins along a direction perpendicular to an extending direction of the plurality of fins.

Optionally, the device further includes an isolation layer on the substrate. The isolation layer covers a portion of sidewalls of the plurality of fins.

Optionally, the device further includes source/drain doped layers in the plurality of fins at two sides of the gate structure.

Optionally, the gate structure includes a gate dielectric layer on top surfaces and sidewalls of the plurality of fins, a work function layer on the gate dielectric layer, and a gate electrode layer on the work function layer.

Another aspect of the present disclosure provides a fabrication method for forming a semiconductor device. The method includes: providing a base substrate; forming a dummy gate structure on the base substrate, where the dummy gate structure including a first portion in a first region and a second portion in a second region; etching part of the first portion of the dummy gate structure in the first region, to form one or more openings in the dummy gate structure in the first region, where bottoms of the opening expose a surface of the base substrate; forming a stop layer in each opening to fill up the opening; removing the dummy gate structure to form a gate opening in the base substrate; forming an initial gate structure in the gate opening; and planarizing the initial gate structure until exposing top surfaces of stop layers, to form a gate structure.

Optionally, the stop layer is made of a material including $SiN_x$, $SiO_2$, SiC, SiON, SiOC, SiCN, SiOCN, SiCBN, or a combination thereof.

Optionally, the stop layer is formed by a chemical vapor deposition method, an atomic layer deposition method, a physical vapor deposition method, or a combination thereof.

Optionally, the stop layer is formed by: forming an initial stop layer on a top surface of the dummy gate structure; and planarizing the initial stop layer until exposing the top surface of the dummy gate structure.

Optionally, the base substrate includes a substrate and a plurality of fins discrete from each other on the substrate. The plurality of fins includes a sparse region and a dense region. A distance between adjacent fins of the plurality of fins in the sparse region is larger than a distance between adjacent fins of the plurality of fins in the dense region.

Optionally, the first portion of the dummy gate structure in the first region is located between the plurality of fins in the sparse region, and the second portion of the dummy gate structure in the second region is located between the plurality of fins in the dense region.

Optionally, the length of each portion of the dummy gate structure is a distance of each portion of the gate structure across corresponding adjacent fins of the plurality of fins along a direction perpendicular to an extending direction of the plurality of fins.

Optionally, after forming the dummy gate structure and before etching part of the first portion of the dummy gate structure in the first region, the method further includes: forming a protective layer on a top surface of the dummy gate structure; and forming side spacers on sidewalls of the dummy gate structure and the protective layer.

Optionally, the method further includes forming source/drain doped layers in the plurality of fins at two sides of the gate structure.

Optionally, the openings are formed by a dry etch process or a wet etch process.

Optionally, the gate structure includes a gate dielectric layer on the base substrate, a work function layer on the gate dielectric layer, and a gate electrode layer on the work function layer.

In the present disclosure, when planarizing the initial gate electrode layer, the planarizing process may be stopped after exposing the top surfaces of the stop layers. A loss of the initial gate electrode layer may be reduced, and the formed gate electrode layer may be prevented from a large loss. Correspondingly, the work function layer may have a good quality and influence on the threshold voltage may be avoided. Further, the surfaces of the plurality of fins may be protected, and the quality of the gate structure and quality of the plurality of fins may be guaranteed, to ensure that the semiconductor device has a stable threshold voltage when operating. The performance of the semiconductor device may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
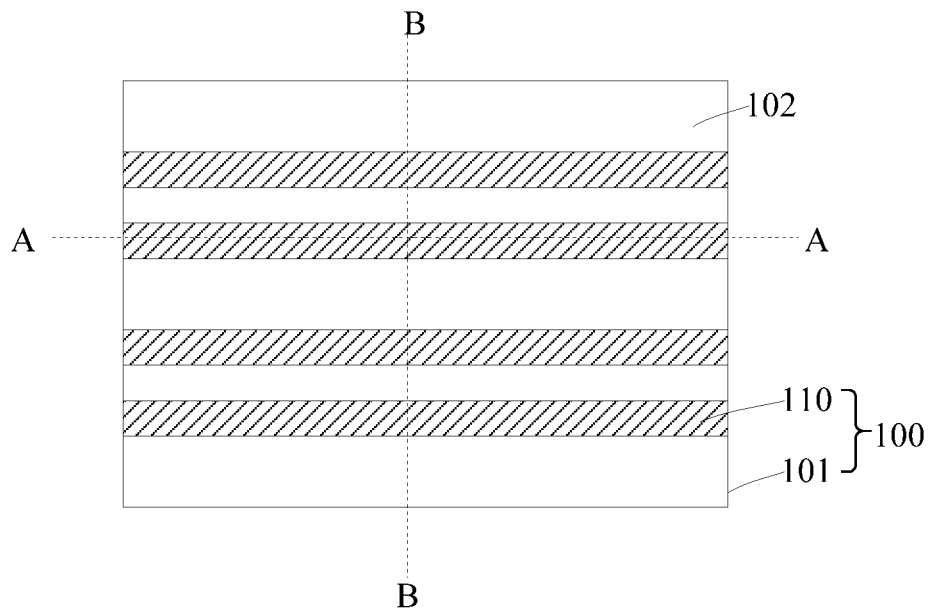
FIGS. 1-12 illustrate semiconductor structures corresponding to certain stages for forming a semiconductor structure.
Figure 2:
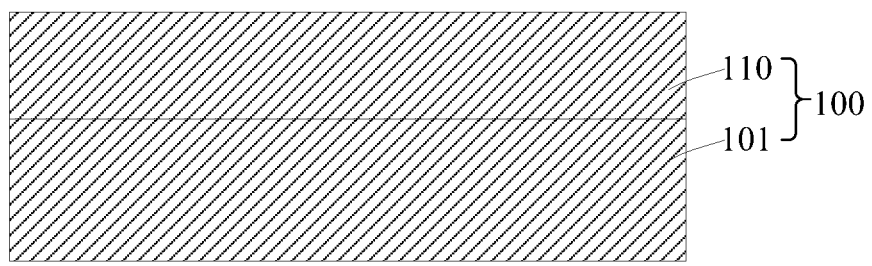
Figure 3:
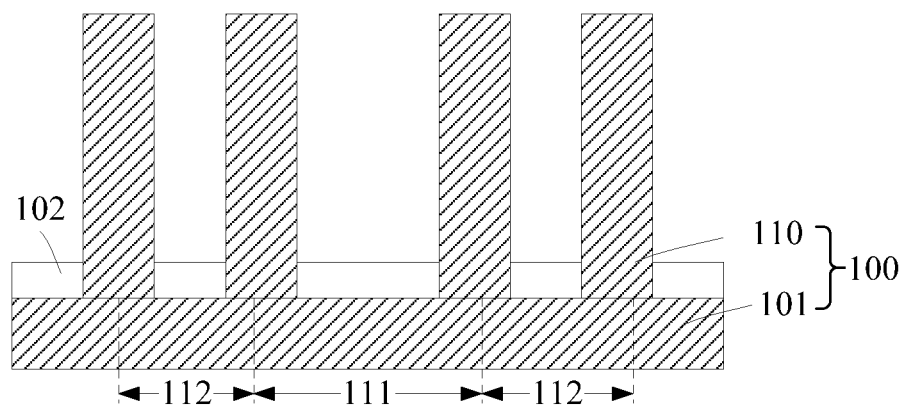

FIGS. 1-12 illustrate semiconductor structures corresponding to certain stages for forming a semiconductor structure. FIG. 1 is a top view of FIG. 2 and FIG. 3, FIG. 2 is a cross-sectional view along an A-A line in FIG. 1, and FIG. 3 is a cross-sectional view along a B-B line in FIG. 1.

As illustrated in FIGS. 1-3, a base substrate 100 is provided. The base substrate 100 includes a substrate 101, a plurality of fins 110 discrete from each other. The plurality of fins 110 includes a sparse region 111 and a dense region 112. A distance between adjacent fins of the plurality of fins 110 in the spare region 111 is larger than a distance between adjacent fins of the plurality of fins 110 in the dense region 112.

An isolation layer 102 is formed on the substrate 101. The isolation layer 102 covers a portion of sidewalls of the plurality of fins 110 at bottoms of the plurality of fins 110.

Figure 4:
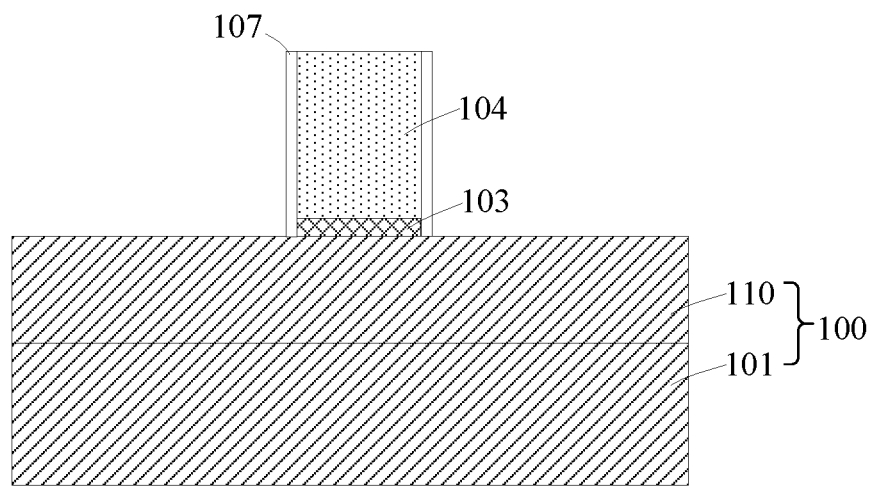
Figure 5:
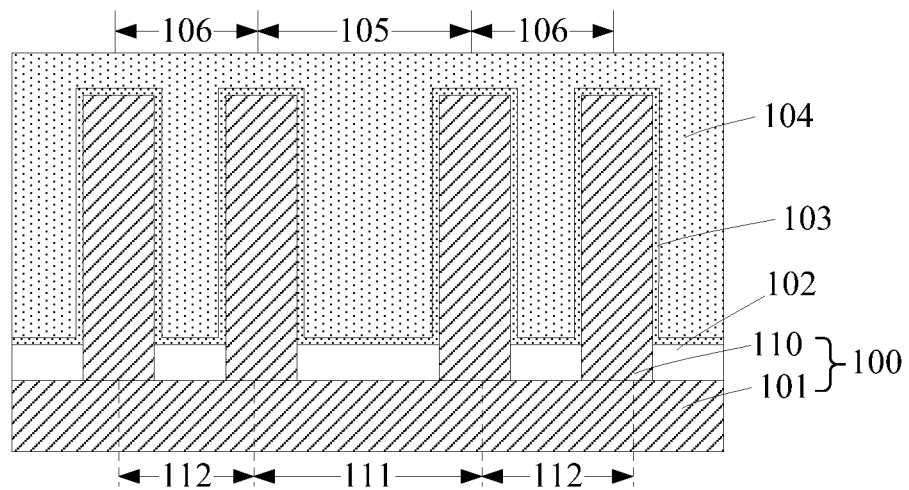

As illustrated in FIG. 4 based on FIG. 2 and FIG. 5 based on FIG. 3, a dummy gate structure is formed on the substrate 101 and the dummy gate structure crosses the plurality of fins 110.

The dummy gate structure includes a dummy gate dielectric layer 103 and a dummy gate electrode layer 104 on the dummy gate dielectric layer 103.

The dummy gate dielectric layer 103 is located on tops and the sidewalls of the plurality of fins 110, and on a top surface of the isolation layer 102.

The dummy gate electrode layer 104 is located on the dummy gate dielectric layer 103.

A side spacer 107 is formed on a sidewall of the dummy gate structure.

The dummy gate structure includes a first portion in a first region 105 and a second portion in a second region 106. A length of the first portion of the dummy gate structure in the first region 105 is larger than a length of the second portion of the dummy gate structure in the second region 106.

As used herein, the "length of each portion of the dummy gate structure" is a distance of the portion of the gate structure across adjacent fins of the plurality of fins along a direction perpendicular to an extending direction of the plurality of fins. For example, as shown in FIG. 5, the first portion of the dummy gate structure across adjacent fins in the first region 105 has a first length in line with a center-to-center distance of the corresponding adjacent fins in the first region 105. Likewise, the second portion of the dummy gate structure across adjacent fins in the second region 106 has a second length in line with a center-to-center distance of corresponding adjacent fins in the second region 106.

Figure 6:
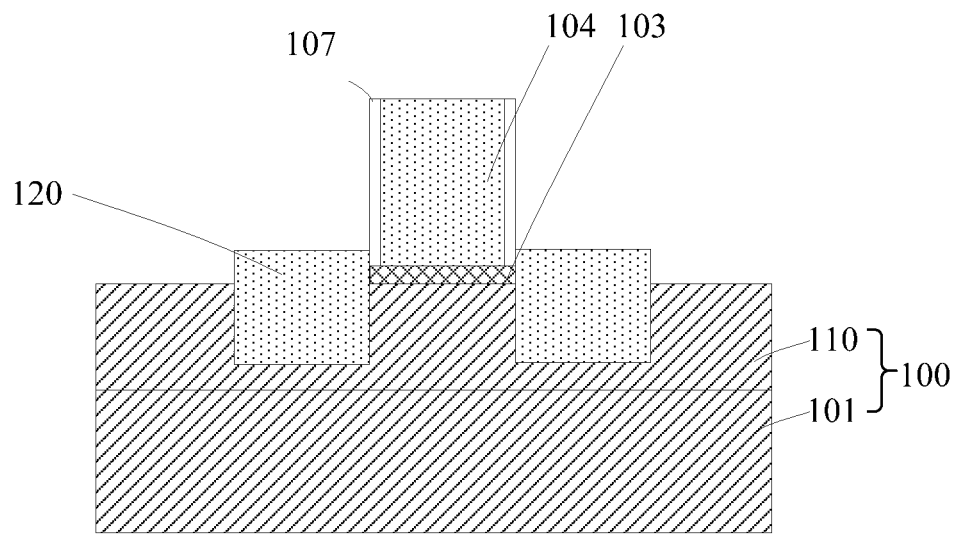

As illustrated in FIG. 6 which has a view angle same as FIG. 4, source/drain doped layers 120 are formed in the plurality of fins 110 at two sides of the dummy gate structure.

Figure 7:
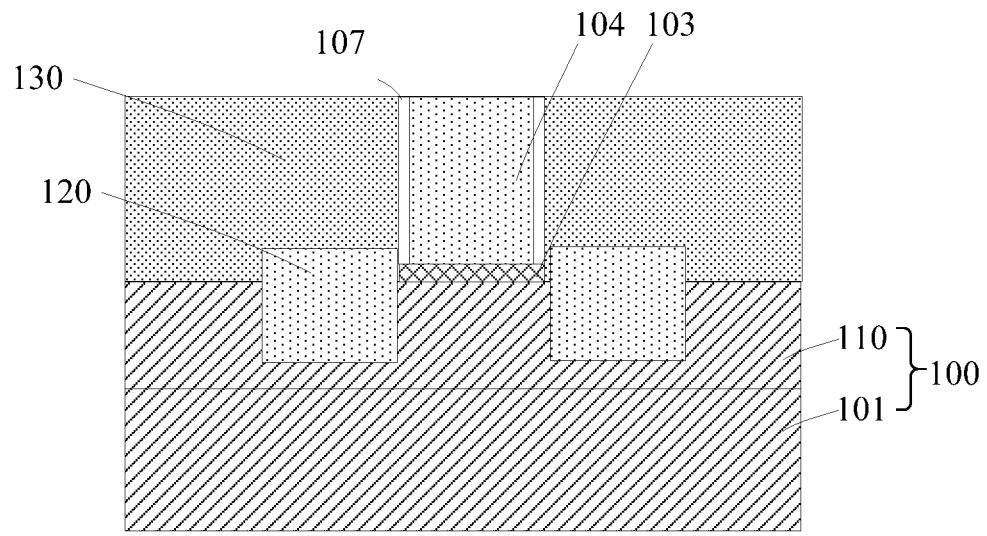

As illustrated in FIG. 7 based on FIG. 6, an interlayer dielectric layer 130 is formed on the source/drain doped layers 120 and on sidewalls of the side spacer 107. A top surface of the interlayer dielectric layer 130 is flush with a top surface of the dummy gate structure.

As illustrated in FIGS. 8-12, the dummy gate structure is removed to form a gate opening (not shown in the figures), and an initial gate structure is formed in the gate opening. Then the initial gate structure is planarized to form a gate structure 140 in the gate opening. The gate structure 140 includes a gate dielectric layer 141, a work function layer 142 and a metal layer 143.

Figure 8:
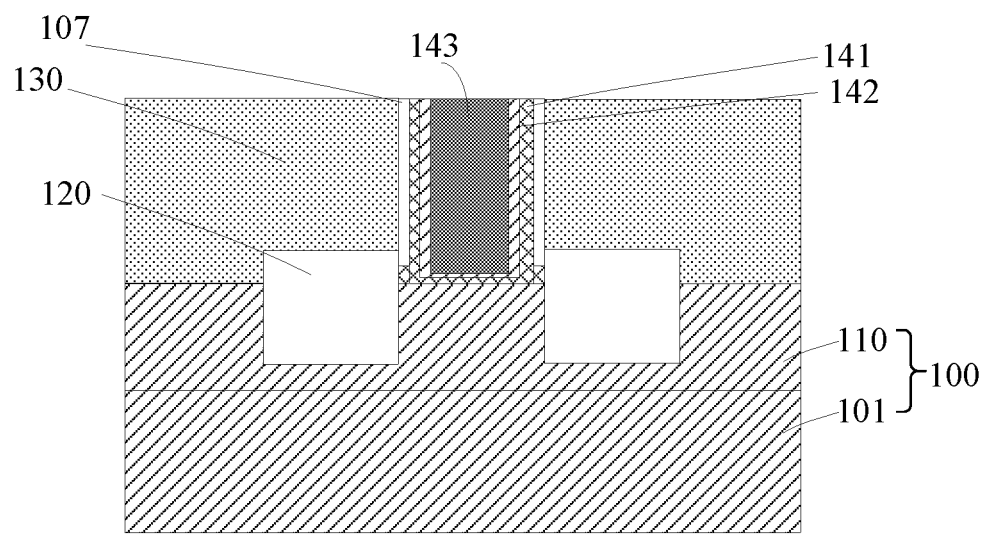
Figure 9:
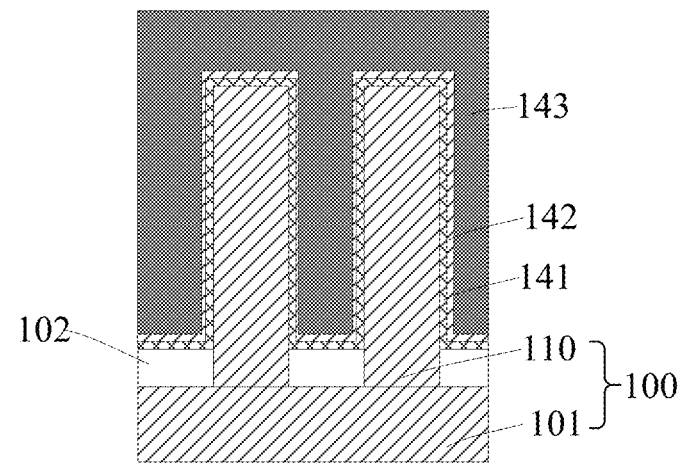
Figure 10:
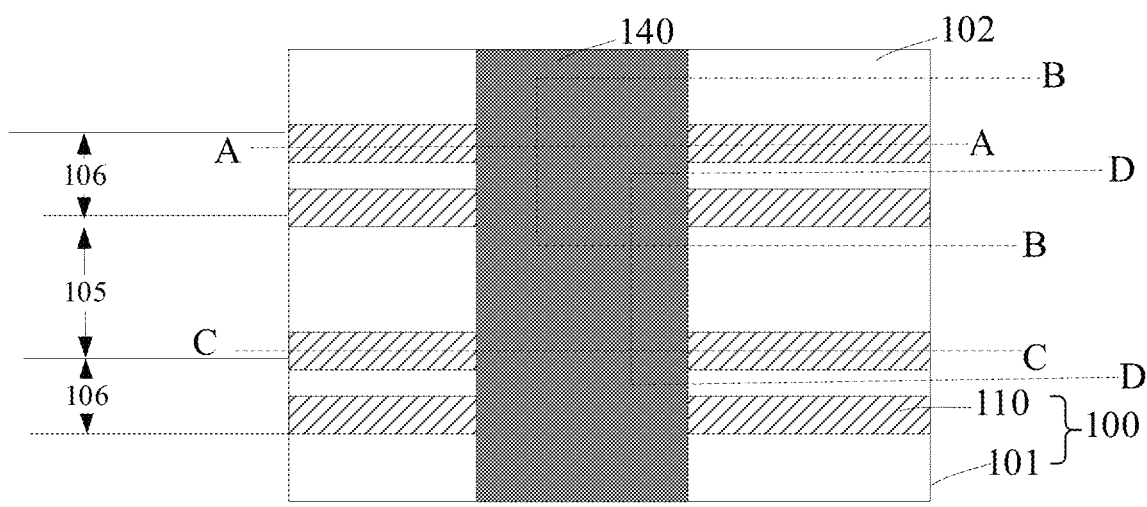
Figure 11:
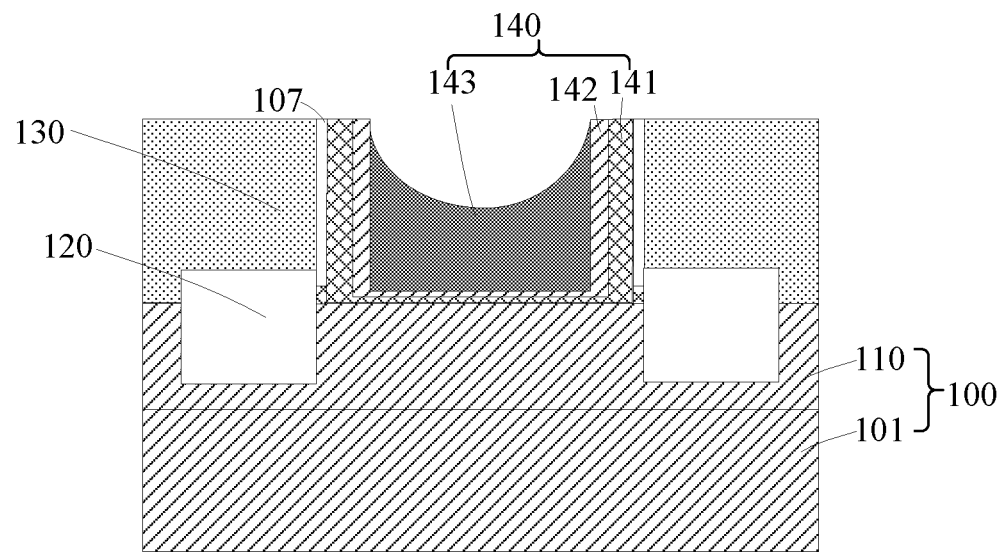
Figure 12:
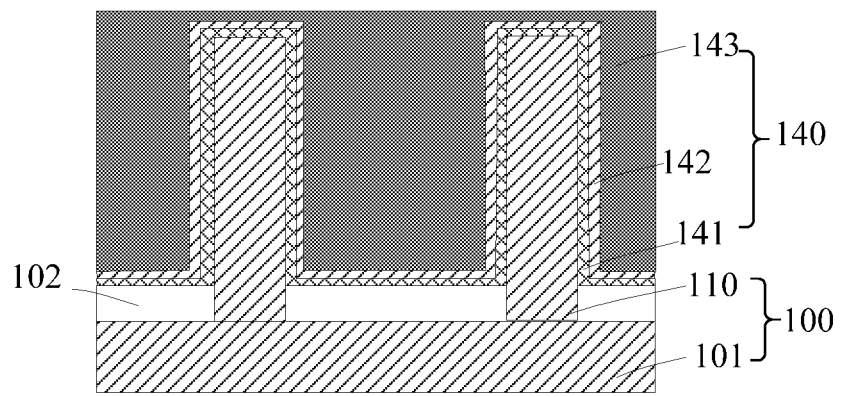

FIG. 10 is a top view of FIG. 8 and FIG. 9. FIG. 8 is a cross-sectional view of FIG. 10 along the A-A line, and FIG. 9 is a cross-sectional view of FIG. 10 along the B-B line. FIG. 11 is a cross-sectional view of FIG. 10 along the C-C line. And FIG. 12 is a cross-sectional view of FIG. 10 along the D-D line.

Compared FIG. 8 to FIG. 11 and FIG. 9 to FIG. 12, in the semiconductor device formed by the above method, when planarizing the initial gate structure to form the gate structure, loss of a middle portion of the initial gate structure is high, and loss of an edge part of the initial gate structure is low. Correspondingly, for the first region where the length of the gate structure is longer, when planarizing the initial gate structure to form the gate structure, loss of a middle portion of the initial gate structure may be even more. The work function layer of the formed gate structure in the first region is easy to be exposed, and even a portion of the plurality of fins in the first region can be exposed. The surfaces of the function layer and the plurality of fins can be damaged, causing instability of threshold voltage. The performance of the formed semiconductor device is poor.

In the present disclosure, before removing the dummy gate structure, a stop layer may be formed on the dummy gate structure in the first region. After removing the dummy gate structure and forming the initial gate structure, when planarizing the initial gate structure, the stop layer may be used as a stop mark for the planarizing process. When a top surface of the stop layer is exposed, the initial gate structure may not be further planarized. The loss of the gate structure in the first region may be reduced, to prevent the damage to the performance of the gate structure in the first region. The performance of the formed semiconductor device may be improved.

The present disclosure provides a fabrication method of a semiconductor device. FIGS. 13-27 illustrate semiconductor structures corresponding to certain stages of forming an exemplary semiconductor structure provided by one embodiment of the present disclosure; and FIG. 28 illustrates an exemplary method for forming a semiconductor device provided by one embodiment of the present disclosure.

Figure 13:
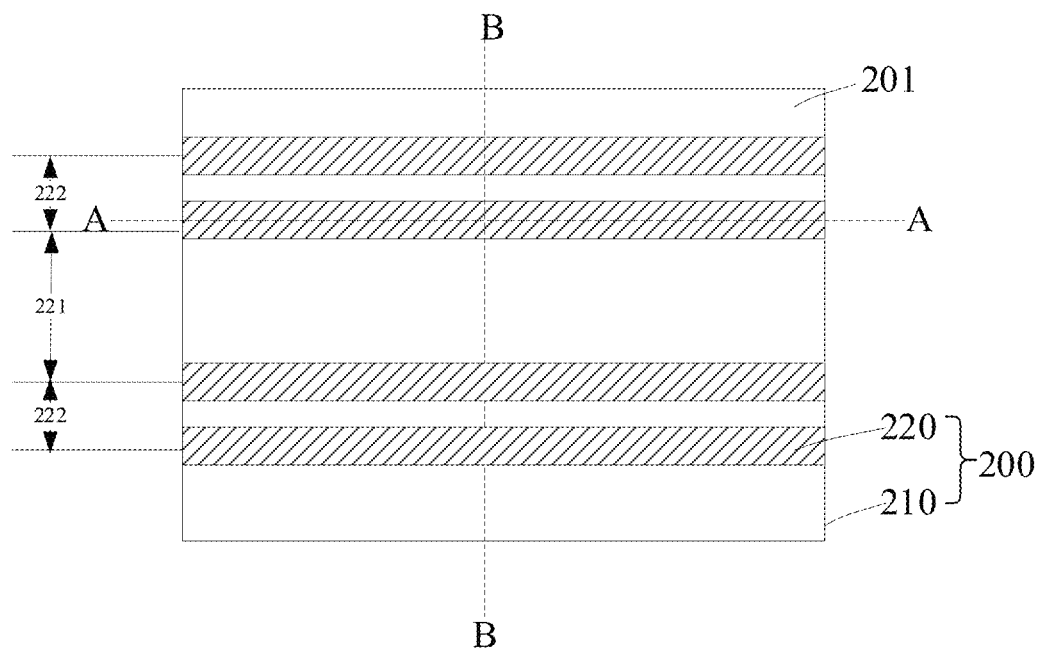
FIGS. 13-27 illustrate semiconductor structures corresponding to certain stages of forming an exemplary semiconductor structure according to various disclosed embodiments of the present disclosure.
Figure 14:
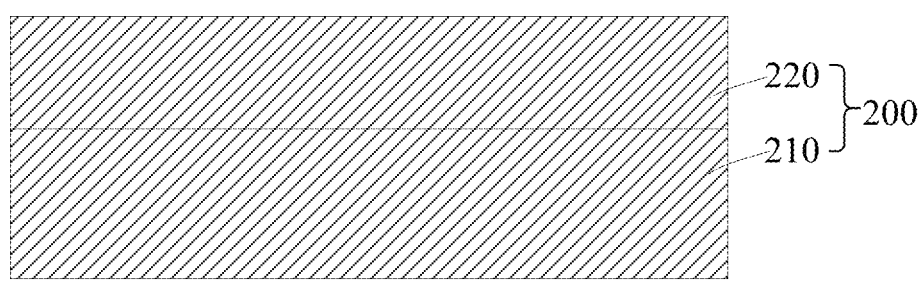
Figure 15:
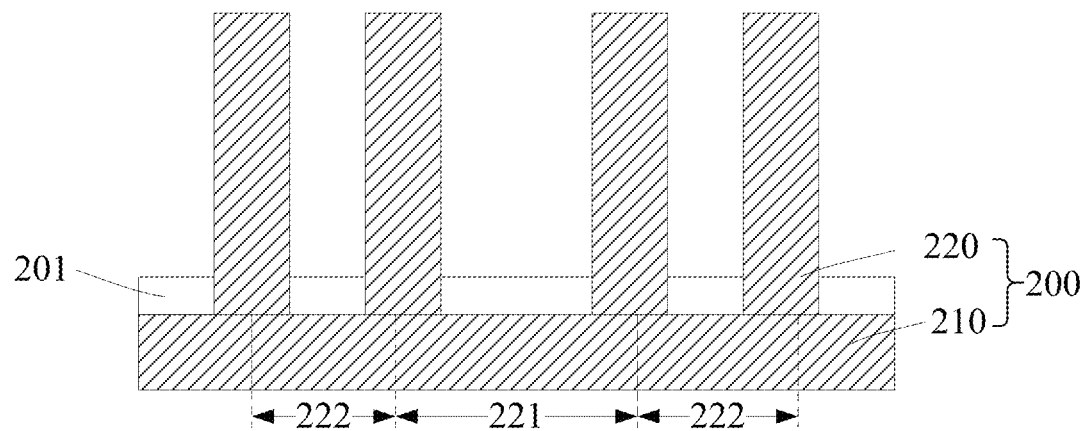
Figure 28:
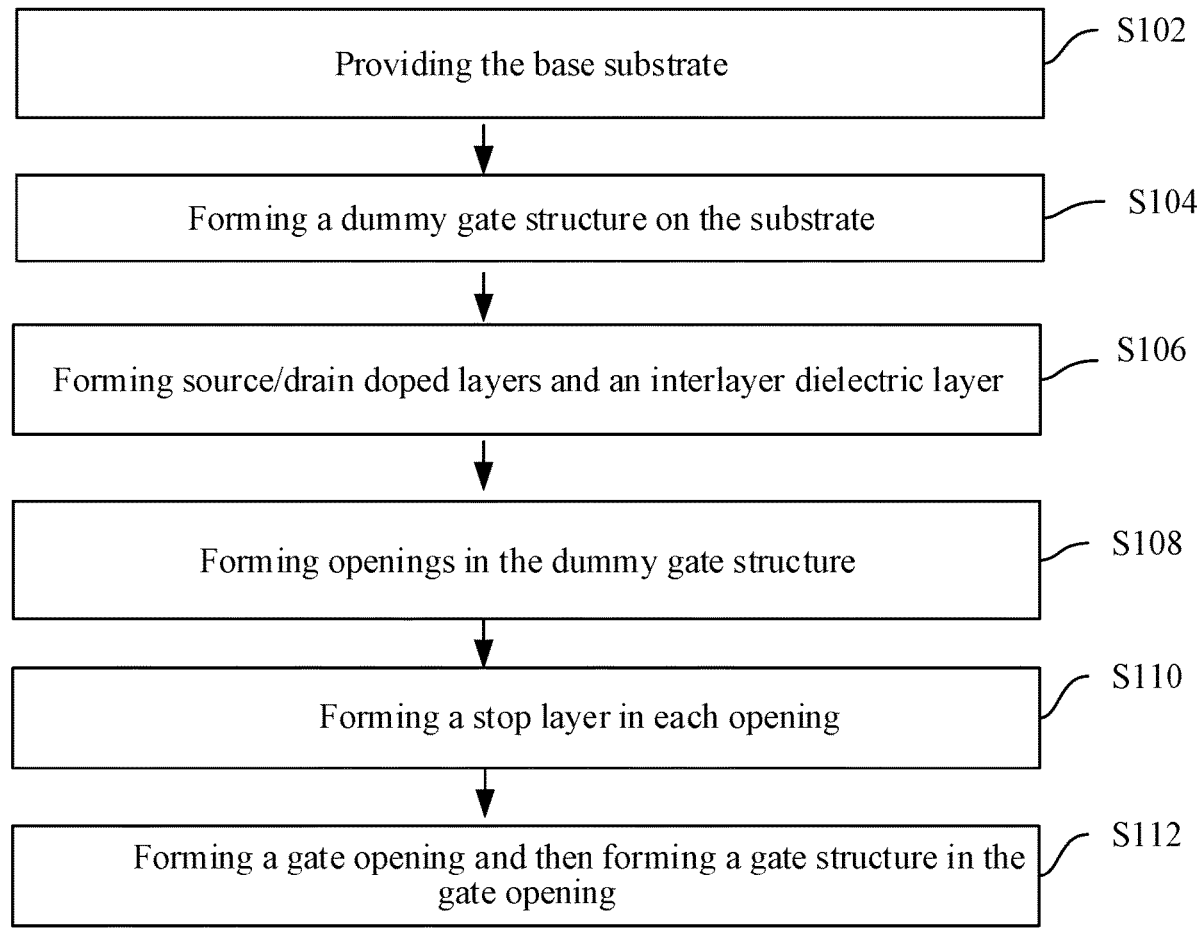
FIG. 28 illustrates an exemplary method for forming a semiconductor device according to various disclosed embodiments of the present disclosure.

As illustrated in FIG. 13 to FIG. 15, a base substrate 200 may be provided (e.g. S102 in FIG. 28).

FIG. 13 is a top view of FIG. 14 and FIG. 15. FIG. 14 is a cross-sectional view of FIG. 13 along an A-A line. FIG. 14 is a cross-sectional view of FIG. 13 along a B-B line.

In one embodiment, the base substrate 200 may include a substrate 210 and a plurality of fins 220 discrete from each other.

In one embodiment, the substrate 210 may be made of single-crystalline silicon. In some other embodiments, the substrate 210 may be made of polycrystalline silicon or amorphous silicon. In some other embodiments, the substrate 210 may be made of a semiconductor material including germanium, SiGe, or GaAs.

In one embodiment, the substrate 210 and the plurality of fins 220 may be made by: providing an initial substrate (now shown); forming a pattern layer on the initial substrate, and etching the initial substrate using the pattern layer as a mask, to form the substrate 210 and the plurality of fins 220.

In one embodiment, the plurality of fins 220 may be made of single-crystalline silicon. In other embodiments, the plurality of fins 220 may be made of a semiconductor material including single-crystalline SiGe.

In some other embodiments, the base substrate 200 may be a structure without fins.

In one embodiment, the base substrate 200 may include the plurality of fins 220. Distances between adjacent fins of the plurality of fins 220 may be different. A region where the distances between adjacent fins of the plurality of fins are larger may be defined as a sparse region 221, and another region where the distances between adjacent fins of the plurality of fins are smaller may be defined as a dense region 222.

In one embodiment, an isolation layer 201 may be formed on the substrate 210. The isolation layer may cover a portion of sidewalls of the plurality of fins 220.

The isolation layer 201 may be formed by: forming an initial isolation layer (not shown) on the substrate 210 to cover the plurality of fins 220; planarizing the initial isolation layer until exposing top surfaces of the plurality of fins 220; and after planarizing, removing a portion of the initial isolation layer to form the isolation layer 201. A top surface of the isolation layer 201 may be lower than the top surfaces of the plurality of fins 220.

In one embodiment, the isolation layer 201 may be made of $SiO_2$. In other embodiment, the isolation layer 201 may be made of a material including $SiN_x$ or SiNO.

Figure 16:
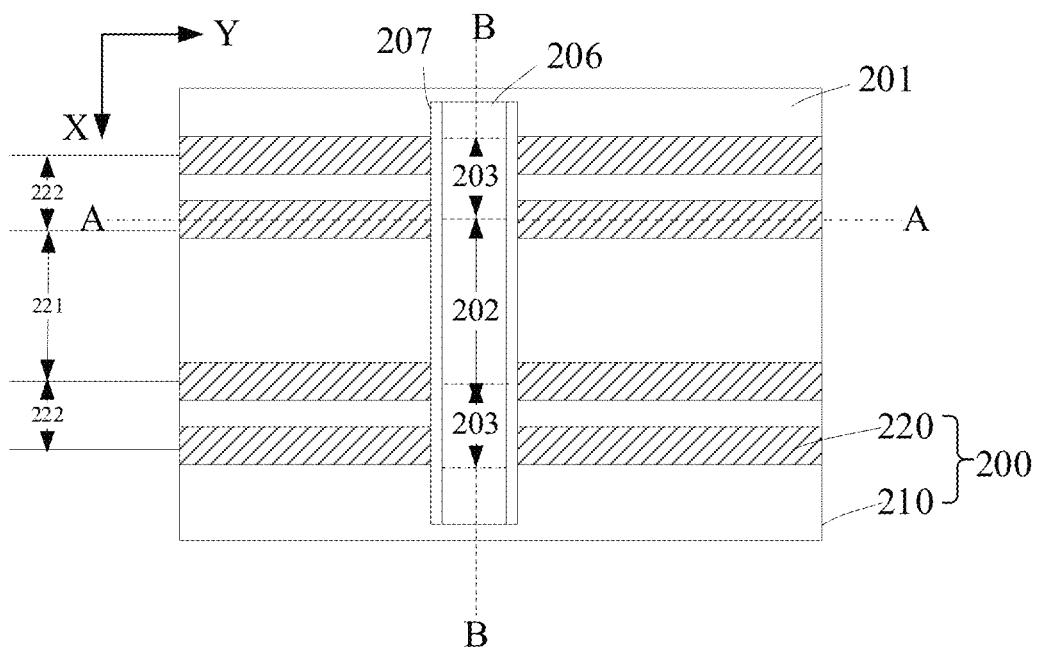
Figure 17:
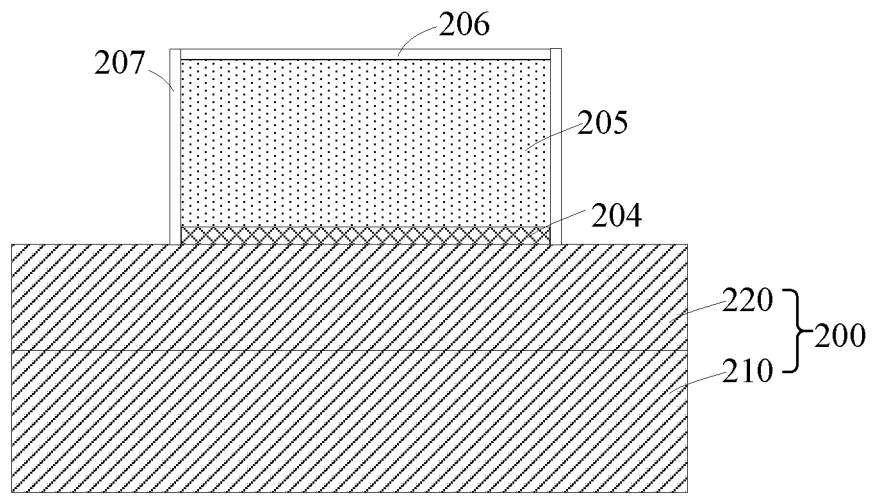
Figure 18:
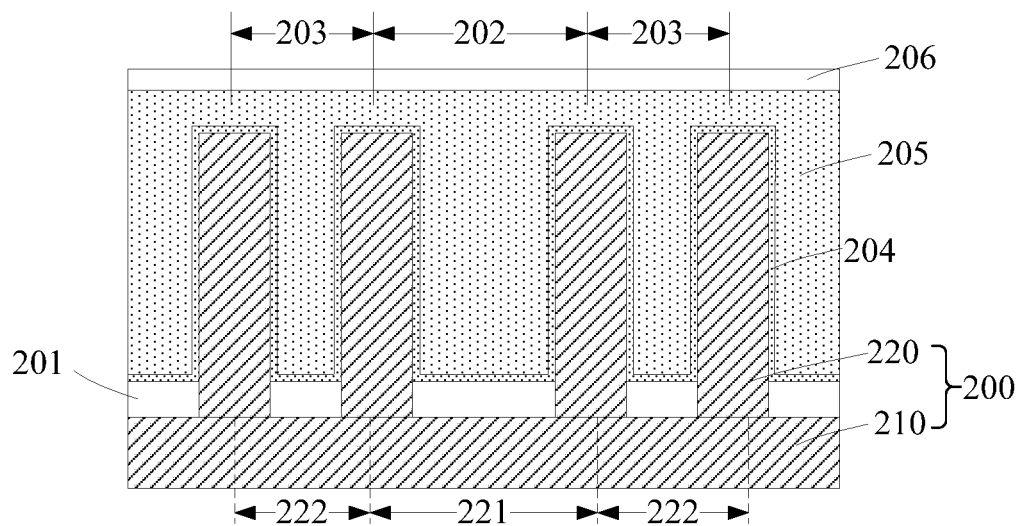

As illustrated in FIG. 16 to FIG. 18, a dummy gate structure may be formed on the base substrate (e.g. S104 in FIG. 28). The dummy gate structure may include a first portion in a first region 202 and a second portion in a second region 203. A length of the first portion of the dummy gate structure in the first region 202 may be larger than a length of the second portion of the dummy gate structure in the second region 203.

The length of each portion of the dummy gate structure may be a distance of the portion of the dummy gate structure across corresponding adjacent fins of the plurality of fins 220 along a direction perpendicular to an extending direction of the plurality of fins 220.

As shown in FIG. 16, the plurality of fins 220 may extend along a direction X. As used herein, the "length of each portion of the dummy gate structure" is a distance of the portion of the dummy gate structure across corresponding adjacent fins of the plurality of fins along a direction perpendicular to X. For example, as shown in FIG. 16, the first portion of the dummy gate structure across adjacent fins in the first region 202 has a first length in line with a center-to-center distance of the corresponding adjacent fins in the first region 202. Likewise, the second portion of the dummy gate structure across adjacent fins in the second region 203 has a second length in line with a center-to-center distance of corresponding adjacent fins in the second region 203.

FIG. 16 is a top view of FIG. 17 and FIG. 18, FIG. 17 is a cross-sectional view of FIG. 16 at an A-A line, and FIG. 18 is a cross-sectional view of FIG. 16 at a B-B line.

In one embodiment, the dummy gate structure may include a dummy gate dielectric layer 204 and a dummy gate electrode layer 205.

The dummy gate dielectric layer 204 may be made of a material including $SiO_2$.

In one embodiment, the dummy gate dielectric layer 204 may be formed by an in-situ steam generation (ISSG) process. The dummy gate dielectric layer 204 formed by the in-situ steam generation process may have a good step coverage capability which can make the formed dummy gate dielectric layer 204 tightly cover the sidewall surfaces of the plurality of fins 220, and the thickness of the dummy gate dielectric layer 204 may be uniform.

The dummy gate electrode layer 205 may be made of a material including polycrystalline silicon.

In another embodiment, the dummy gate dielectric layer 204 may be formed by a chemical oxidation process. The chemical oxidation process may include: oxidizing the exposed sidewalls and top surface of the plurality of fins 220 with an ozone solution to form the dummy gate dielectric layer 204.

In one embodiment, the dummy gate structure may be formed on the substrate 210. The dummy gate structure may cross the plurality of fins 220. The dummy gate structure in the first region 202 may be located between adjacent fins of the plurality of fins 220 in the sparse region 221, and the dummy gate structure in the second region 203 may be located between adjacent fins of the plurality of fins 220 in the dense region 222.

In one embodiment, a protective layer 206 may be formed on a top of the dummy gate structure.

In one embodiment, the protective layer 206 may be made of $SiN_x$. In other embodiments, the protective layer 206 may be made of a material including $SiO_2$, SiC, SiON, SiOC, SiCN, SiOCN, SiCBN, or a combination thereof.

In one embodiment, the protective layer 206 may prevent the top surface of the dummy gate structure from damage in the subsequent processes.

In one embodiment, side spacers 207 may be formed on sidewalls of the dummy gate structure and the protective layer 206.

The side spacers 207 may be used to define positions of source/drain doped layers formed subsequently. The side spacers 207 may also be used to protect the sidewalls of the dummy gate electrode layer 205, to prevent formation of profile defects in a gate electrode layer formed subsequently and prevent the performance of the semiconductor device from being affected.

In one embodiment, the side spacers 207 may be made of $SiO_2$. In other embodiments, the side spacers 207 may be made of a material including $SiN_x$, SiC, SiON, or a combination thereof.

Figure 19:
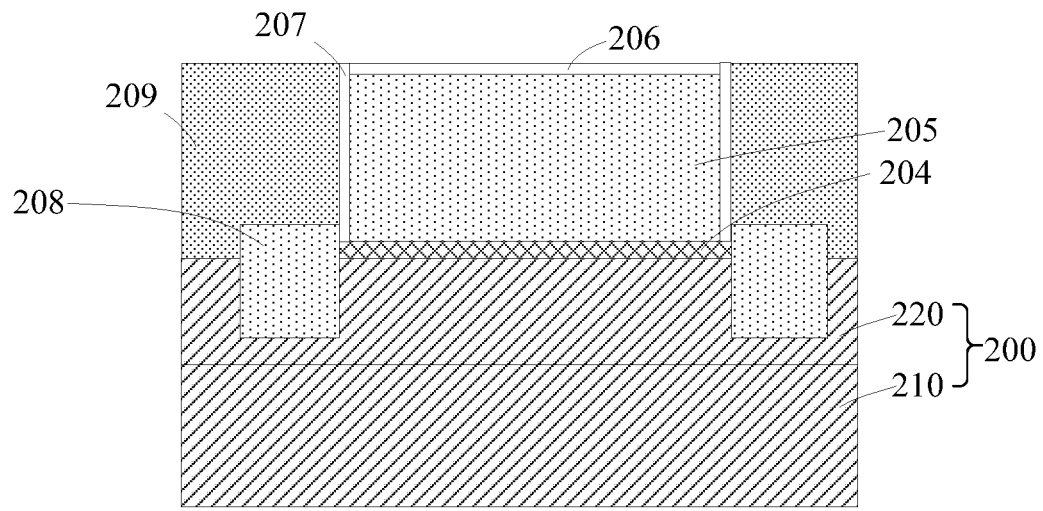

As illustrated in FIG. 19 with a view angle same as the view angle of FIG. 17, source/drain doped layers 208 may be formed in the plurality of fins 220 at two sides of the dummy gate structure. An interlayer dielectric layer 209 may be formed on the source/drain doped layer 208. The interlayer dielectric layer 209 may cover the sidewalls of the dummy gate structure (e.g. S106 in FIG. 28).

In one embodiment, the source/drain doped layers 208 may be formed in the plurality of fins 220 at two sides of the side spacers 207. The interlayer dielectric layer 209 may be formed on the source/drain doped layer 208. The interlayer dielectric layer 209 may cover the sidewalls of the side spacers 207.

In one embodiment, the interlayer dielectric layer 209 may be formed by a chemical vapor deposition process. In other embodiments, the interlayer dielectric layer 209 may be formed by an atomic layer deposition process or a physical vapor deposition process.

In one embodiment, the interlayer dielectric layer 209 may be made of $SiO_2$. In other embodiments, the interlayer dielectric layer 209 may be made of a material including $SiN_x$, SiC, SiON, SiOC, SiCN, SiOCN, SiCBN, or a combination thereof.

Figure 20:
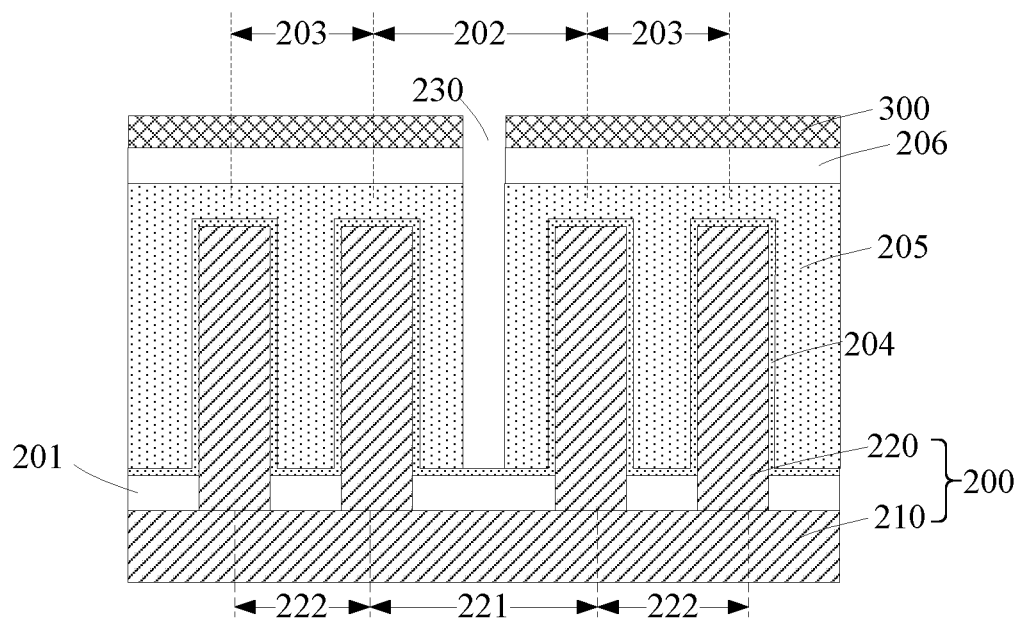

As illustrated in FIG. 20 with a view angle same as the view angle of FIG. 18, a pattern layer 300 may be formed on a top surface of the protective layer 206, and part of the first portion of the dummy gate structure in the first region 202 may be etched by using the pattern layer 300 as a mask, to form openings 230 in the dummy gate structure in the first region 202 (e.g. S108 in FIG. 28). Bottoms of the openings 230 may expose a surface of the base substrate 200.

In one embodiment, part of the first portion of the dummy gate electrode layer 205 in the first region 202 may be etched by using the pattern layer 300 as a mask, to form the openings 230 in the first portion of the dummy gate electrode layer 205 in the first region 202. The bottoms of the openings 230 may expose a surface of the dummy gate dielectric layer 204.

In one embodiment, the number of the openings may be one. In some other embodiment, the number of the openings may be two or more.

In one embodiment, the openings 230 may provide a space for forming stop layers subsequently.

In one embodiment, the openings 230 may be formed by a dry etch process. In other embodiments, the openings 230 may be formed by a wet etch process.

Figure 21:
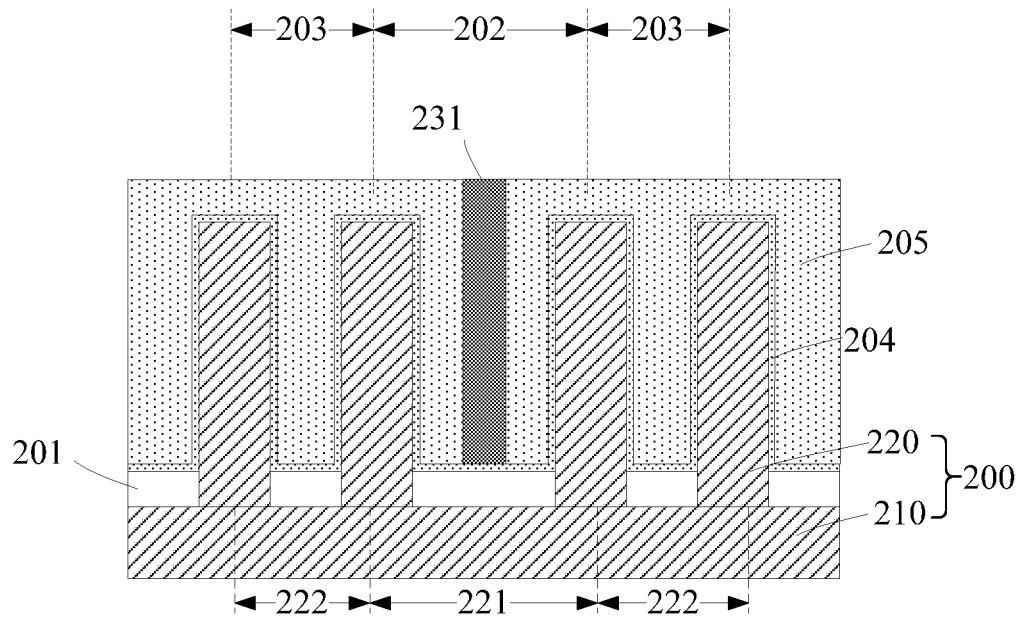
Figure 22:
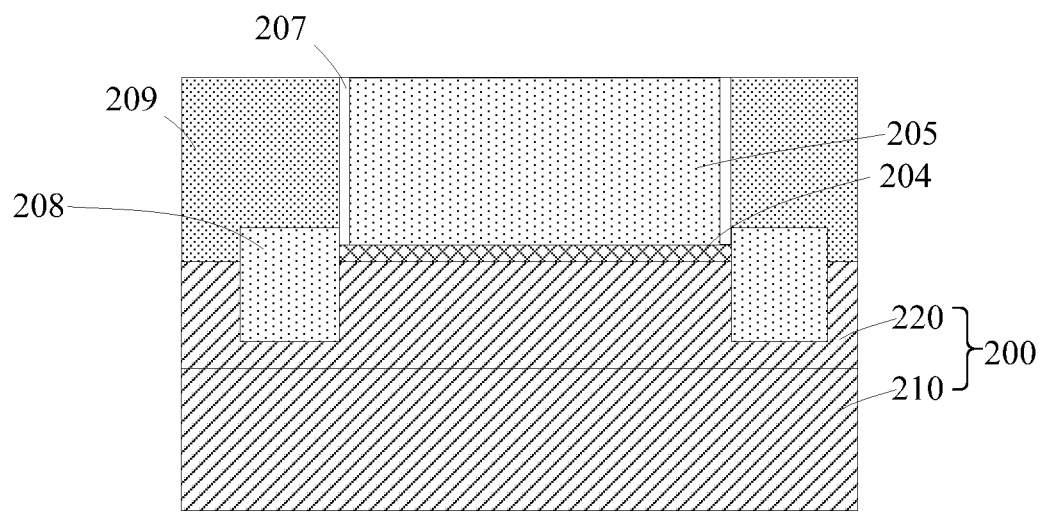

As illustrated in FIG. 21 with a view angle same as the view angle of FIG. 20 and FIG. 22 with a view angle same as the view angle of FIG. 19, a stop layer 231 may be formed in each opening 230 (e.g. S110 in FIG. 28). One stop layer 231 may fill up one corresponding opening 230.

In one embodiment, the number of stop layers 231 may be one, and may be same as the number of openings 230.

In another embodiment, the number of the stop layers 231 may be two or more, e.g., formed in the dummy gate structure in the first region 202.

In one embodiment, before forming one stop layer 231 in each opening 230, the pattern layer 300 and the protective layer 206 may be removed. Each stop layer 231 may fill up one corresponding opening 230.

In one embodiment, the pattern layer 300 and the protective layer 206 may be removed by an etch process. In other embodiments, the pattern layer 300 and the protective layer 206 may be removed by an ash process.

In one embodiment, the stop layers 231 may be formed by: forming an initial stop layer on the top surface of the dummy gate structure and in the openings 230; and planarizing the initial stop layer until exposing the top surface of the dummy gate structure, to form one stop layer 231 in each opening 230.

In one embodiment, the stop layers 231 may be formed by an atomic layer deposition method. The atomic layer deposition method may form the stop layers 231 with a better covering gradient. The stop layers 231 may fill the openings 230 with a high quality.

In one embodiment, the stop layers 231 may be made of $SiN_x$. In other embodiments, the stop layers 231 may be made of a material including $SiO_2$, SiC, SiON, SiOC, SiCN, SiOCN, SiCBN, or a combination thereof.

Figure 23:
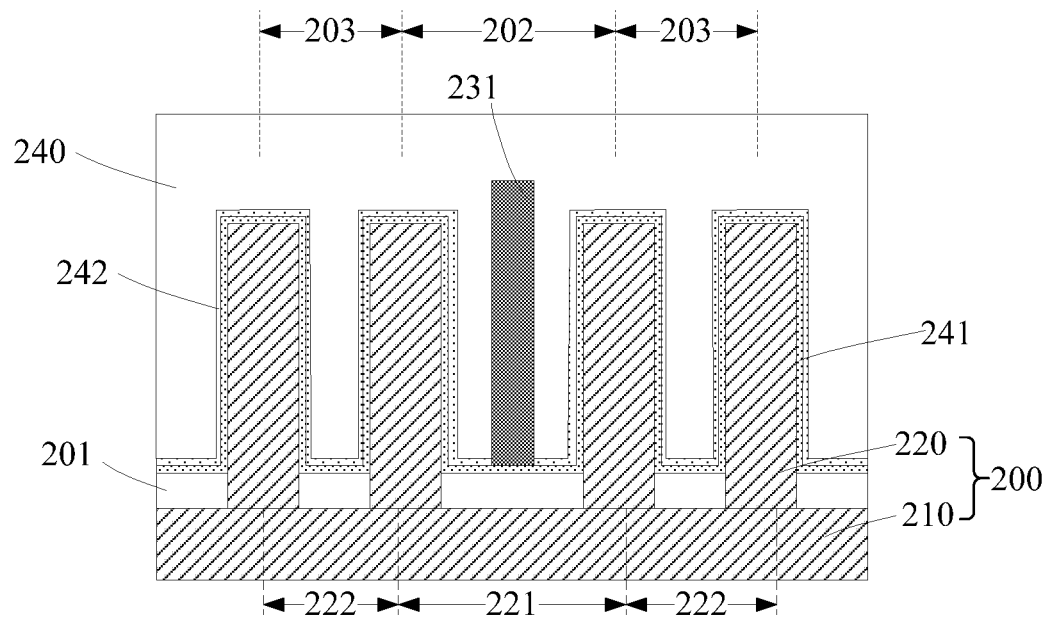
Figure 24:
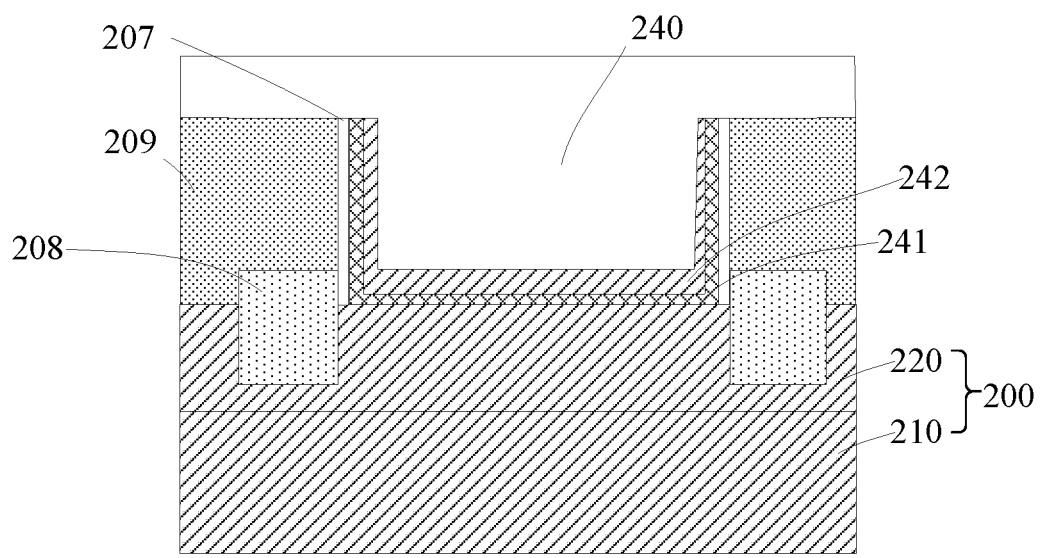

As illustrated in FIG. 23 with a view angle same as the view angle of FIG. 21 and FIG. 24 with a view angle same as the view angle of FIG. 22, a gate opening may be formed on the base substrate and an initial gate structure may be formed in the gate opening (e.g. S112 in FIG. 28).

In one embodiment, the dummy gate dielectric layer 204, the dummy gate electrode layer 205, and the protective layer 206 on the top surface of the dummy gate electrode layer 205 may be removed.

In one embodiment, the initial gate structure may include a gate dielectric layer 241, a work function layer 242, and an initial gate electrode layer 240. The gate dielectric layer 241 may be formed on sidewalls and a top of the gate opening. The work function layer 241 may be formed on the gate dielectric layer, and the initial gate electrode layer 240 may be formed on the work function layer 242 and may fill up the gate opening.

The gate dielectric layer 241 may be made of a high-k dielectric material (with a dielectric constant larger than 3.9) including $HfO_2$, $ZrO_2$, $HfSiO_2$, $La_2O_3$, $ZrSiO_2$, $TiO_2$, $TaO_2$, $(TiBaSr)O_2$, $(TiSr)O_2$, $Al_2O_3$, or a combination thereof.

The work function layer 242 may be made of a material including TaN, TiSiN, TaSiN, TaAl, TiAlC, AlN, TiAlN, TaAlN, or a combination thereof.

The initial gate electrode layer 240 may be made of a metal including copper, tungsten, nickel, chromium, titanium, tantalum, aluminum, or a combination thereof.

Figure 25:
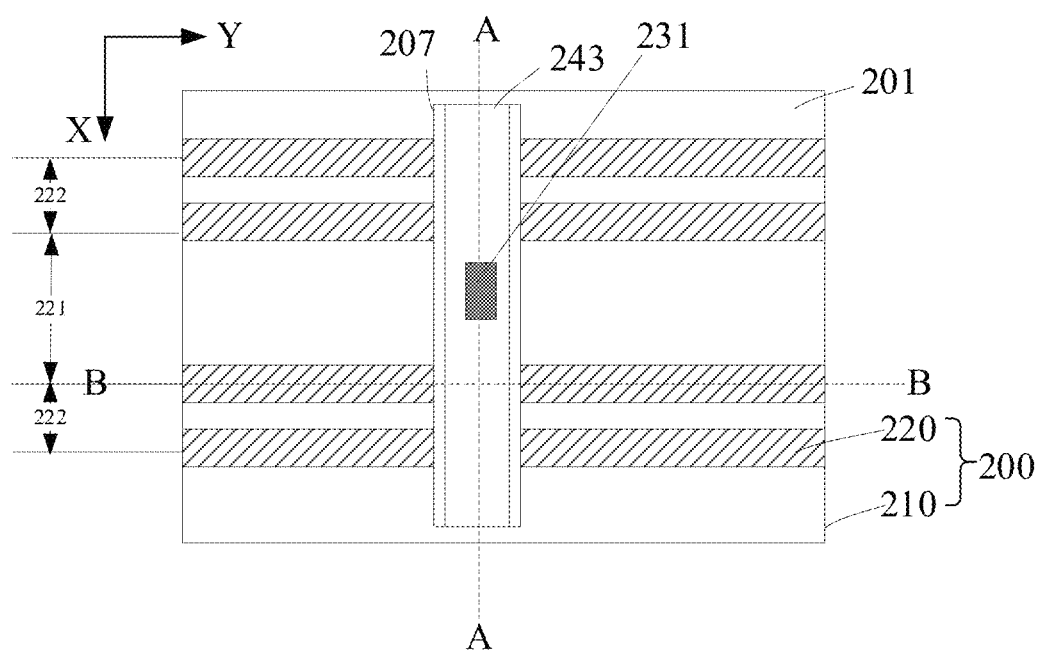
Figure 26:
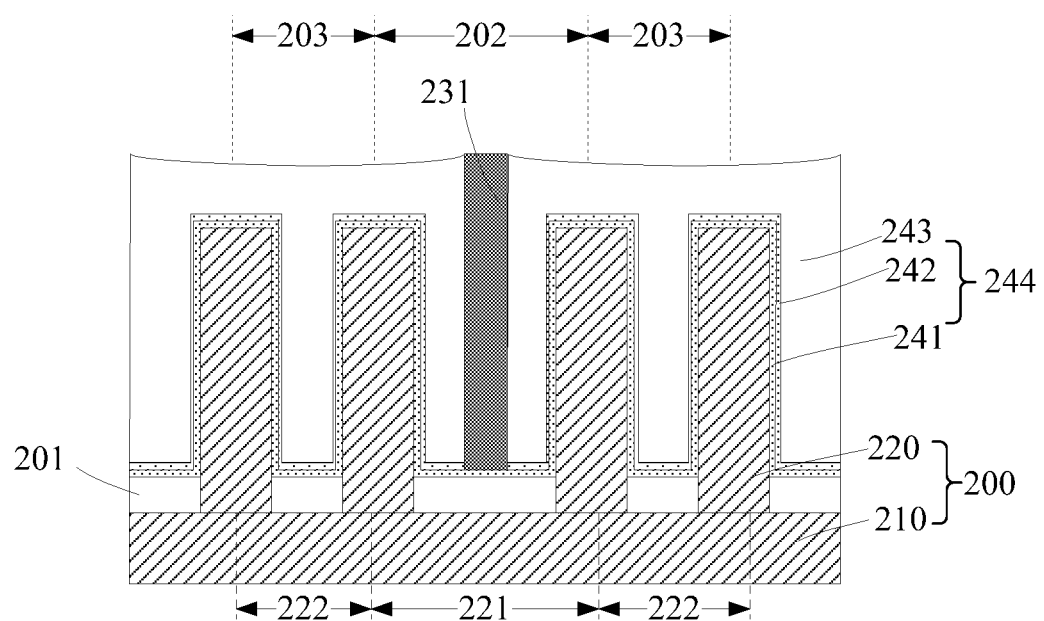
Figure 27:
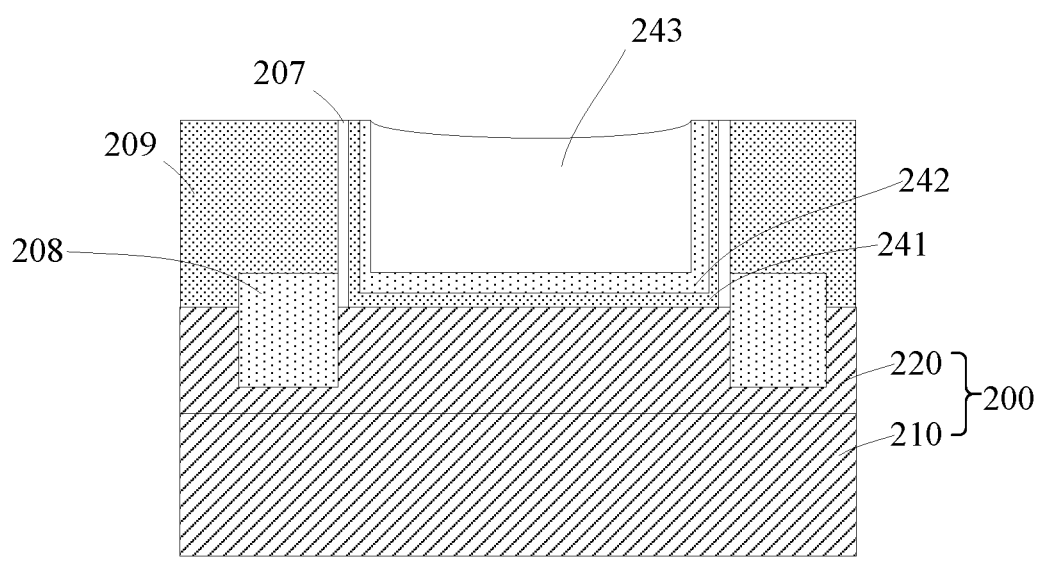

As illustrated in FIG. 25 to FIG. 27, the initial gate electrode layer 240 may be planarized until exposing the top surfaces of the stop layers 231, to form a gate electrode layer 243 (e.g. S112 in FIG. 28).

FIG. 25 is a plan view of FIG. 26 and FIG. 27, FIG. 26 is a cross-sectional view of FIG. 25 along the line A-A, and FIG. 27 is a cross-sectional view of FIG. 25 along the line B-B.

In the present disclosure, comparing FIG. 26 to FIG. 12, and FIG. 27 to FIG. 11, because of the stop layers 231, when planarizing the initial gate electrode layer 240, the planarizing process may be stopped after exposing the top surfaces of the stop layers 231. A loss of the initial gate electrode layer 240 may be reduced, and the formed gate electrode layer 243 may be prevented from a large loss. Correspondingly, the work function layer may have a good quality and influence on the threshold voltage may be avoided. Further, the surfaces of the plurality of fins may be protected, and quality of the gate structure and quality of the plurality of fins may be guaranteed, to ensure that the semiconductor device has a stable threshold voltage when operating. The performance of the semiconductor device may be improved.

In one embodiment, the initial gate electrode layer 240 may be planarized by a chemical mechanical polishing process.

The present disclosure also provides a semiconductor device. The semiconductor device may include a base substrate 200, a gate structure 214 on the base substrate 200, and stop layers 231. The gate structure 244 may include a first portion in a first region 202 and a second portion in a second region 203. A length of the first portion of the gate structure in the first region 202 may be larger than a length of the second portion of the gate structure in the second region 203. The stop layers 231 may be disposed on the base substrate 200 and in the first portion of the gate structure in the first region 202.

In one embodiment, the stop layers 231 may be disposed on the base substrate 200 and in the first portion of the gate structure in the first region 202. The stop layers 231 may cut the first portion of the gate structure 244 in the first region 202, to achieve gate cut of the gate structure 244 in the first region 202. Further, when forming the gate structure, the stop layers 231 may be used as a stop mark of the gate structure. The gate structure may be prevented from a large loss during the fabrication process, to improve the quality of the gate structure.

The number of the stop layers 231 may be one or more. In one embodiment, the number of the stop layers 231 may be one. In some other embodiments, the number of the stop layers 231 may be two or more.

In one embodiment, the stop layers 231 may be made of $SiN_x$. In other embodiments, the stop layers 231 may be made of a material including $SiO_2$, SiC, SiON, SiOC, SiCN, SiOCN, SiCBN, or a combination thereof.

In one embodiment, the base substrate 200 may include a substrate 210 and a plurality of fins 220 discrete from each other. The plurality of fins 220 includes a sparse region 221 and a dense region 222. A distance between adjacent fins of the plurality of fins 220 in the sparse region 221 is larger than a distance between adjacent fins of the plurality of fins 220 in the dense region 222.

In one embodiment, the gate structure 244 may be disposed on the substrate 210 and cross the plurality of fins 220. The first portion of the gate structure 244 in the first region 202 may be located between the plurality of fins 220 in the sparse region 221, and the second portion of the gate structure 244 in the second region 203 may be located between the plurality of fins 220 in the dense region 222.

As used herein, the "length of each portion of the gate structure" is a distance of the portion of the gate structure across adjacent fins of the plurality of fins along a direction perpendicular to an extending direction of the plurality of fins.

In one embodiment, the gate structure 244 may include a gate dielectric layer 241, a work function layer 242, and a gate electrode layer 243. The gate dielectric layer 241 may be formed on the top surfaces and sidewalls of the plurality of fins 220. The work function layer 241 may be formed on the gate dielectric layer. The gate electrode layer 240 may be formed on the work function layer 242, and may be made of a metal.

In one embodiment, the semiconductor device may further include an isolation layer 201. The isolation layer 201 may be formed on the substrate 210 to cover a portion of sidewalls of the plurality of fins 220. The isolation layer 201 may be used to electrically isolate adjacent fins of the plurality of fins 220.

In one embodiment, the isolation layer 201 may be made of $SiO_2$. In other embodiment, the isolation layer 201 may be made of a material including $SiN_x$ or SiNO.

In one embodiment, the semiconductor device may further include source/drain doped layers 208 in the plurality of fins 220 at two sides of the gate structure 244.

The source/drain doped layers 208 may be formed by an epitaxial growth process of an in-situ doping process.

In one embodiment, the semiconductor device may further include an interlayer dielectric layer 209. The interlayer dielectric layer 209 may be located on the source/drain doped layers 208 and may cover sidewall surfaces of the gate structure 244.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor device, comprising:
   a base substrate, the base substrate including a substrate and a plurality of fins discrete from each other on the substrate;
   a gate structure on the base substrate, wherein the gate structure includes a first portion in a first region and a second portion in a second region, and a length of the first portion of the gate structure in the first region is larger than a length of the second portion of the gate structure in the second region; and
   a plurality of stop layers on the base substrate and located in the first portion of the gate structure in the first region, the plurality of stop layers being made of a material including SiCBN;
   wherein:
   the gate structure includes a gate dielectric layer on top surfaces and sidewalls of the plurality of fins, a work function layer on the gate dielectric layer, and a gate electrode layer on the work function layer; and
   the gate dielectric layer is in contact with a bottom surface of the plurality of stop layers, the work function layer and the gate electrode layer are in contact with sidewall surfaces of the plurality of stop layers.

2. The device according to claim 1, wherein:
   the plurality of fins includes a sparse region and a dense region; and
   a distance between adjacent fins of the plurality of fins in the sparse region is larger than a distance between adjacent fins of the plurality of fins in the dense region.

3. The device according to claim 2, wherein:
   the first portion of the gate structure in the first region is located between the plurality of fins in the sparse region, and the second portion of the gate structure in the second region is located between the plurality of fins in the dense region.

4. The device according to claim 2, wherein:
   the length of each portion of the gate structure is a distance of each portion of the gate structure across corresponding adjacent fins of the plurality of fins along a direction perpendicular to an extending direction of the plurality of fins.

5. The device according to claim 2, further including an isolation layer on the substrate, wherein:
the isolation layer covers a portion of sidewalls of the plurality of fins.

6. The device according to claim 2, further including source/drain doped layers in the plurality of fins at two sides of the gate structure.

7. The device according to claim 2, further including an interlayer dielectric layer on the source/drain doped layers and sidewalls of the gate structure.

8. A fabrication method of a semiconductor device, comprising:
providing a base substrate, the base substrate including a substrate and a plurality of fins discrete from each other on the substrate;
forming a dummy gate structure on the base substrate, wherein the dummy gate structure including a first portion in a first region and a second portion in a second region, and a length of the first portion of the gate structure in the first region is larger than a length of the second portion of the gate structure in the second region;
etching part of the first portion of the dummy gate structure in the first region, to form a plurality of openings in the dummy gate structure in the first region, wherein bottoms of the plurality of openings expose a surface of the base substrate;
forming a stop layer in each opening of the plurality of openings to fill up the opening, the plurality of stop layers being made of a material including SiCBN;
removing the dummy gate structure to form a gate opening in the base substrate;
forming an initial gate structure in the gate opening; and
planarizing the initial gate structure until exposing top surfaces of the plurality of stop layers, to form a gate structure;
wherein:
the gate structure includes a gate dielectric layer on top surfaces and sidewalls of the plurality of fins, a work function layer on the gate dielectric layer, and a gate electrode layer on the work function layer; and
the gate dielectric layer is in contact with a bottom surface of the plurality of stop layers, the work function layer and the gate electrode layer are in contact with sidewall surfaces of the plurality of stop layers.

9. The method according to claim 8, wherein:
the plurality of stop layers are formed by a chemical vapor deposition method, an atomic layer deposition method, a physical vapor deposition method, or a combination thereof.

10. The method according to claim 8, wherein each of the plurality of stop layers is formed by:
forming an initial stop layer in each opening and on a top surface of the dummy gate structure; and
planarizing the initial stop layer until exposing the top surface of the dummy gate structure.

11. The method according to claim 8, wherein:
the plurality of fins includes a sparse region and a dense region; and
a distance between adjacent fins of the plurality of fins in the sparse region is larger than a distance between adjacent fins of the plurality of fins in the dense region.

12. The method according to claim 11, wherein:
the first portion of the dummy gate structure in the first region is located between the plurality of fins in the sparse region, and the second portion of the dummy gate structure in the second region is located between the plurality of fins in the dense region.

13. The method according to claim 11, wherein:
the length of each portion of the dummy gate structure is a distance of each portion of the dummy gate structure across adjacent fins of the plurality of fins along a direction perpendicular to an extending direction of the plurality of fins.

14. The method according to claim 8, after forming the dummy gate structure and before etching part of the first portion of the dummy gate structure in the first region, further including:
forming a protective layer on a top surface of the dummy gate structure; and
forming side spacers on sidewalls of the dummy gate structure and the protective layer.

15. The method according to claim 11, further including:
forming source/drain doped layers in the plurality of fins at two sides of the gate structure.

16. The method according to claim 8, wherein:
the openings are formed by a dry etch process or a wet etch process.

* * * * *